United States Patent
Fu et al.

(10) Patent No.: US 7,848,712 B2
(45) Date of Patent: Dec. 7, 2010

(54) CMOS RF SWITCH FOR HIGH-PERFORMANCE RADIO SYSTEMS

(75) Inventors: Chang-Tsung Fu, Hillsboro, OR (US); Stewart S. Taylor, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 728 days.

(21) Appl. No.: 11/799,981

(22) Filed: May 3, 2007

(65) Prior Publication Data

US 2008/0272824 A1  Nov. 6, 2008

(51) Int. Cl.
*H04B 1/46* (2006.01)
(52) U.S. Cl. ............... 455/80; 455/78; 455/79; 455/82; 455/83; 333/100; 333/101
(58) Field of Classification Search ............. 455/73–84, 455/552.1, 553.1; 333/101, 103, 104; 327/308, 327/365
See application file for complete search history.

(56) References Cited

U.S. PATENT DOCUMENTS

| | | | | |
|---|---|---|---|---|
| 6,078,797 | A * | 6/2000 | Kashimura | 455/234.1 |
| 6,671,496 | B1 * | 12/2003 | Hoshi | 455/78 |
| 7,199,635 | B2 * | 4/2007 | Nakatsuka et al. | 327/308 |
| 7,345,545 | B2 * | 3/2008 | Glass et al. | 330/277 |
| 2003/0190895 | A1 * | 10/2003 | Mostov et al. | 455/78 |
| 2004/0033787 | A1 * | 2/2004 | Weber et al. | 455/78 |
| 2005/0159113 | A1 * | 7/2005 | Iida | 455/78 |

* cited by examiner

*Primary Examiner*—Tuan A Tran
(74) *Attorney, Agent, or Firm*—Scott M. Lane

(57) ABSTRACT

A wireless device includes high-performance CMOS RF switches that include serially connected transistors coupled between an input terminal and an output terminal, with an inductor coupled from the input to the output that resonates out the capacitance of the transistors to improve isolation. The transistors have a floating/bootstrapped body with remote body contacts.

16 Claims, 6 Drawing Sheets

CMOS RF SWITCH FOR HIGH-PERFORMANCE RADIO SYSTEMS

Technological developments permit digitization and compression of large amounts of voice, video, imaging, and data information. Evolving applications have greatly increased the transfer of large amounts of data from one wireless device to another across a network. Currently, the Radio Frequency (RF) platforms used in transferring data across these networks utilize discrete devices to interface the antennas with the transceiver. The discrete devices pose limitations on the size and cost of implementing wireless devices, limitations that are becoming a more serious impediment. Therefore, improved circuits and methods for implementing wireless designs are needed.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
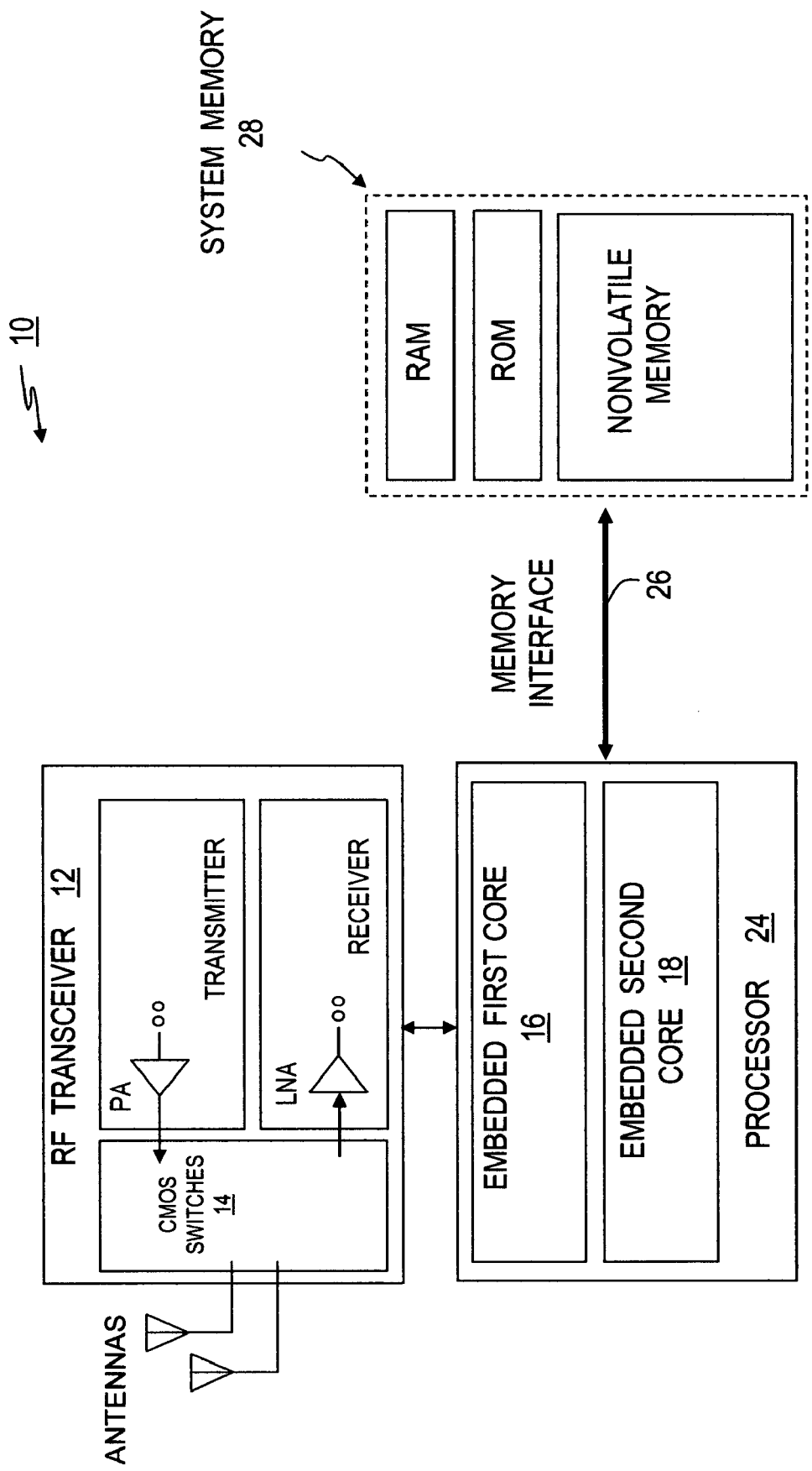
FIG. 1 is a diagram of a wireless device that implements a CMOS RF switch in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

The embodiment illustrated in FIG. 1 shows a wireless communications device 10 that includes one or more radios to allow communication with other over-the-air communication devices. Communications device 10 may operate in wireless networks such as, for example, Wireless Fidelity (Wi-Fi) that provides the underlying technology of Wireless Local Area Network (WLAN) based on the IEEE 802.11 specifications, WiMax and Mobile WiMax based on IEEE 802.16-2005, Wideband Code Division Multiple Access (WCDMA), and Global System for Mobile Communications (GSM) networks, although the present invention is not limited to operate in only these networks. The radio subsystems collocated in the same platform of communications device 10 provide the capability of communicating in an RF/location space with the other devices in the network.

The simplistic embodiment illustrates the coupling of antenna(s) to the transceiver 12 to accommodate modulation/demodulation. Analog transceiver 12 may be embedded with a processor 24 as a mixed-mode integrated circuit where the processor processes functions that fetch instructions, generate decodes, find operands, and perform appropriate actions, then stores results. The processor may include baseband and applications processing functions and utilize one or more processor cores 16 and 18 to handle application functions and allow processing workloads to be shared across the cores. The processor may transfer data through an interface 26 to memory storage in a system memory 28.

The figure further illustrates high-performance RF switches 14 employed with the diversity antenna(s) for a variety of purposes such as, for example, multiplexing the antenna to a Low Noise Amplifier (LNA) or multiplexing the antenna to a Power Amplifier (PA), among other uses. Whereas traditional RF switches have been fabricated with Gallium Arsenide (GaAs) Metal-Semiconductor Field Effect Transistors (MESFETs) or High-Electron-Mobility-Transistors (PHEMTs), the RF switches 14 in the present invention are fabricated in a Complementary Metal-Oxide Semiconductor (CMOS) technology with the transmitter and receiver to provide a completely integrated radio. Therefore, in contrast to the prior art discrete switches processed with a technology that is different from the transceiver, the present invention uses a common processing technology that provides a lower cost solution and a smaller form factor.

Figure 2:
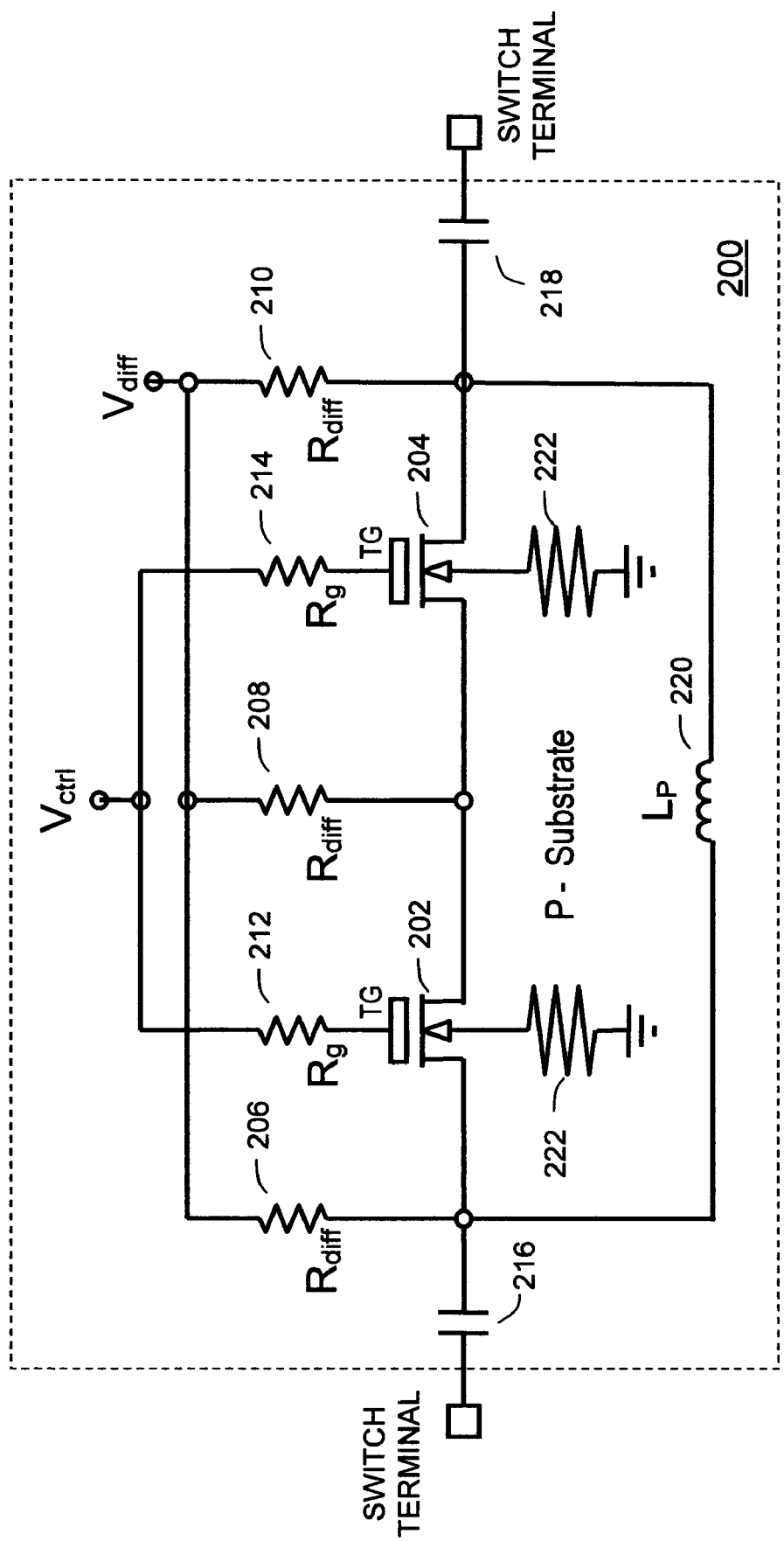
FIG. 2 illustrates an embodiment of the RF switch in accordance with the present invention.

FIG. 2 illustrates an embodiment of a CMOS RF switch 200 that may be integrated on a single chip as part of transceiver 12. The simplified schematic diagram includes CMOS pass transistors (switches) 202 and 204 with resistors 206, 208 and 210 commonly connected to a DC voltage $V_{diff}$ to provide a proper bias potential to the source and drain terminals of the pass transistors. Resistors 212 and 214 are gate isolating resistors commonly connected to a control voltage $V_{ctrl}$ and further connected to the gate terminals of transistors 202 and 204. DC blocking capacitors 216 and 218 respectively isolate an input terminal and an output terminal from the remaining portions of the switch. An inductor 220 is connected in parallel with the serially connected transistors 202 and 204.

In operation, RF switch 14 is "on" or closed when the potential $V_{ctrl}$ supplied to the gates of transistors 202 and 204 is greater than the potential $V_{diff}$ supplied to the source and drain terminals of transistors 202 and 204. In one embodiment, a potential $V_{ctrl}$ that is higher than the potential $V_{diff}$ by approximately one volt or more is sufficient to operate RF switch 14 in the "on" condition. On the other hand, switch 14 is "off" or open when the potential $V_{ctrl}$ is less than the potential $V_{diff}$, also typically by one volt or more. RF switch 14 is designed with a floating body 222 that may be bootstrapped using remote body contacts.

Note that transistors 202 and 204 may be designed having physical geometries that provide a compromise between on the resistance (insertion loss, power handling) and an isolation (capacitance). Further note that the resistance values for $R_{diff}$, i.e., the resistance value of resistors 206, 208 and 210, and the resistance values for $R_g$, i.e., the resistance value of resistors 212 and 214, are generally non-critical and of sufficient value for low loss and bootstrapping (isolation—the capacitance of transistors 202 and 204 holds $V_{gs}$ and $V_{bs}$ approximately constant over the frequency range of the RF signals). The capacitance values of capacitors 216 and 218 are selected to pass the lowest frequency in the range of frequency spectrum received by the wireless device. The inductance of inductor 220 resonates out the capacitance of the transistors 202 and 204 to improve isolation, which may also be improved with the proper layout. The use of remote body contacts for transistors 202 and 204 may allow the body to be bootstrapped to improve power handling capabilities of RF switch 14.

Figure 3:
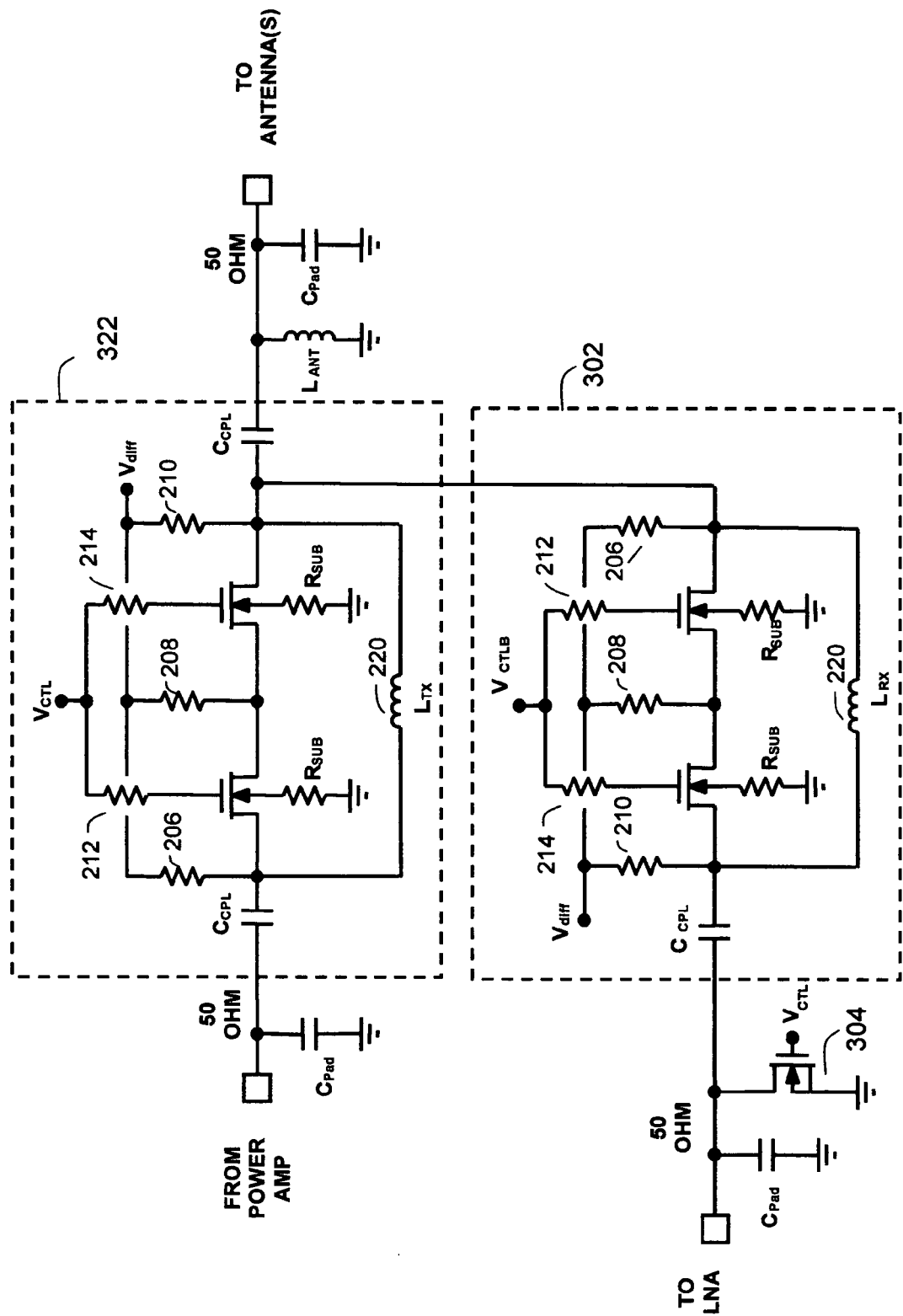
FIG. 3 is a schematic diagram of a CMOS SPDT T/R switch in accordance with the present invention.

FIG. 3 is a circuit schematic of a Single Pole, Double Throw (SPDT) Transmit/Receive (T/R) switch, which consists of two switch units. The two switch units include an Rx switch 302 and a Tx switch 322 capable of being processed in a CMOS technology with the transceiver. Note the addition of a shunt transistor 304 with Rx switch 302 that is controlled by a signal $V_{CTL}$ to shunt the output signal of the switch for improved isolation (attenuation) when Rx switch 302 is "off" and Tx switch 322 is "on".

Figure 4:
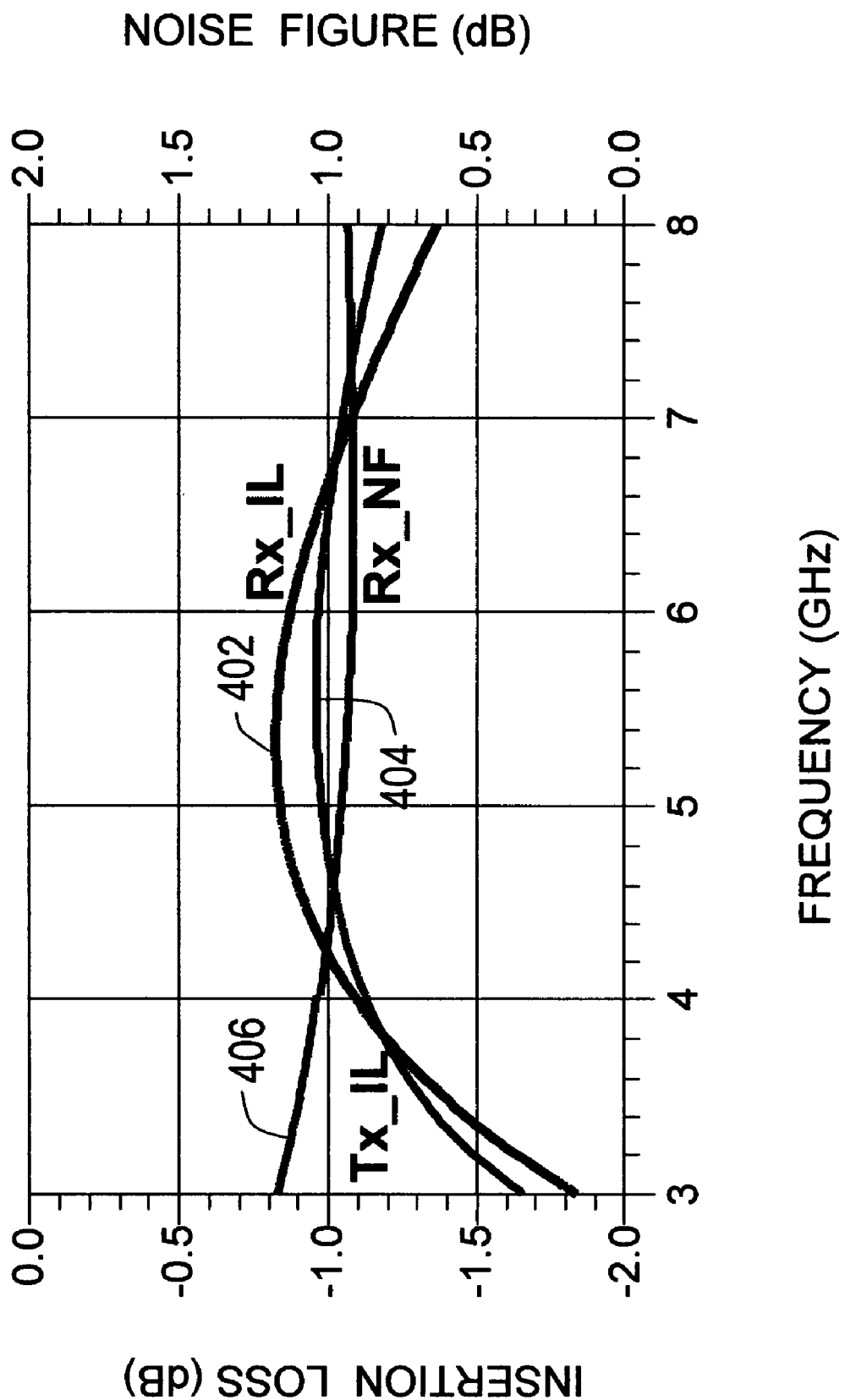
FIG. 4 shows the insertion loss and noise figure of the CMOS SPDT T/R switch illustrated in FIG. 3 with the switch in the "ON" state.
Figure 5:
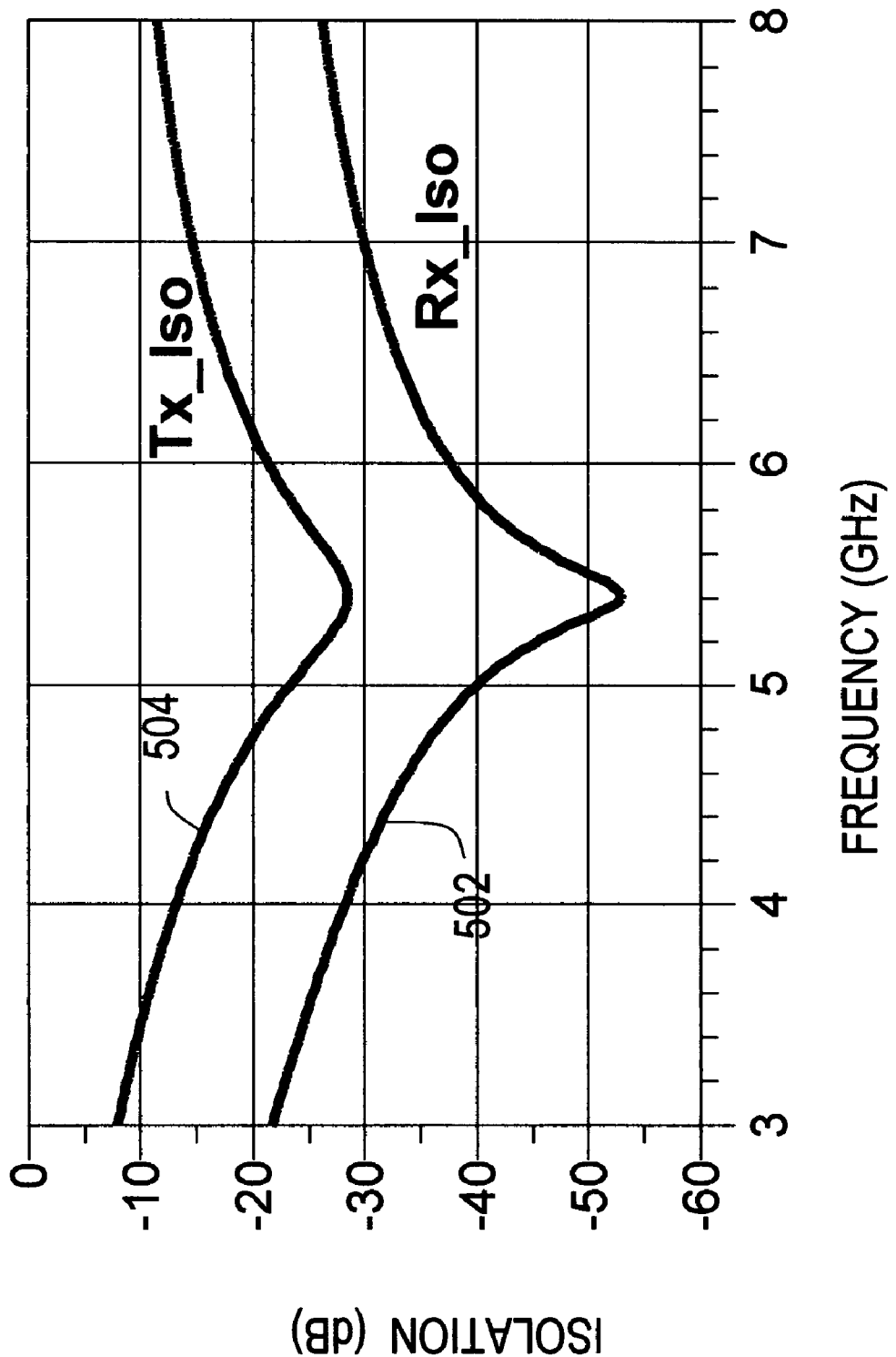
FIG. 5 shows the isolation of the CMOS SPDT T/R switch in the "OFF" state.
Figure 6:
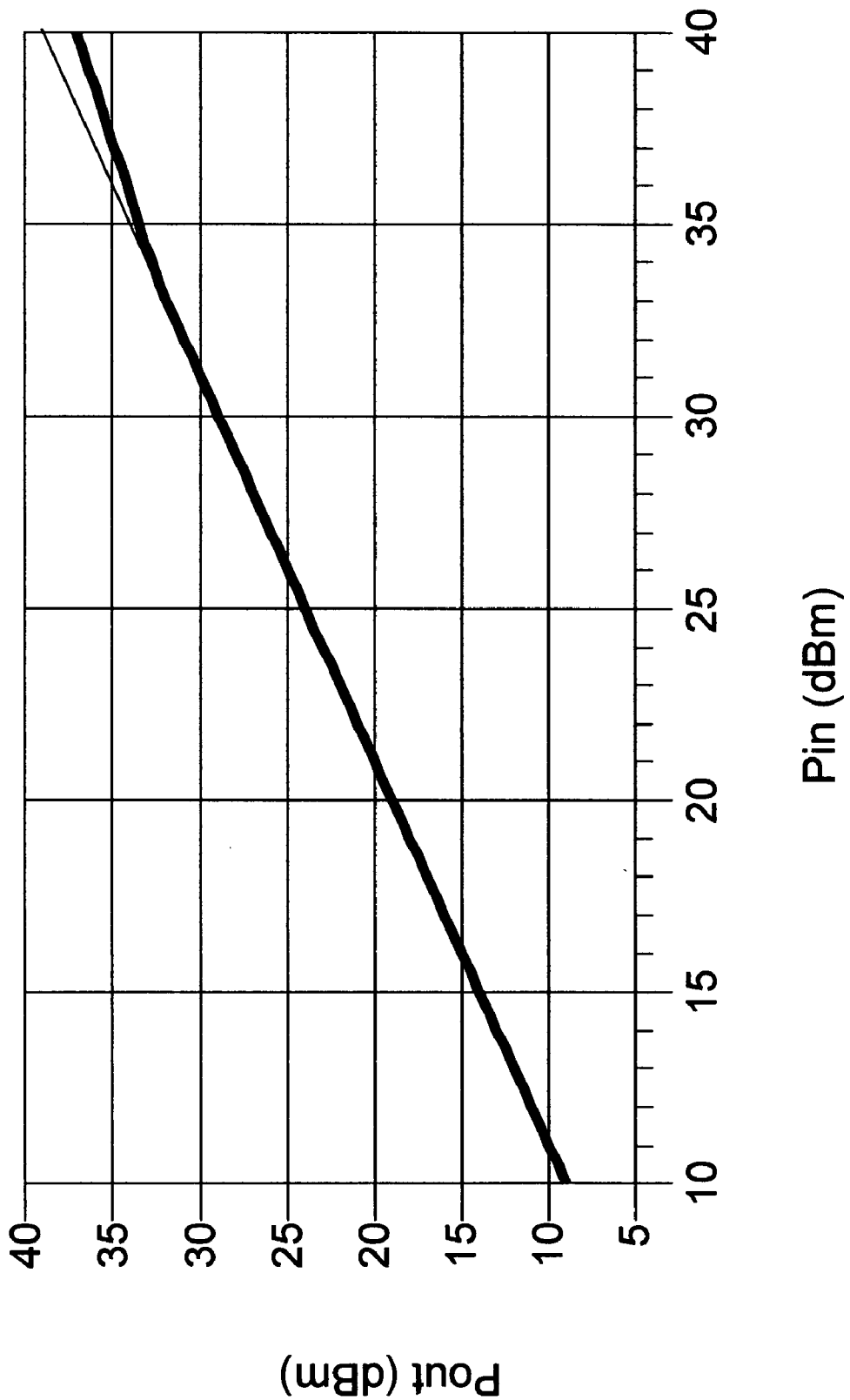
FIG. 6 is 1 dB compression point of the CMOS RF SPDT T/R switch in the "ON" state.

FIGS. 4-6 are simulation results for the Rx switch 302 and the Tx switch 322 as shown in FIG. 3; including insertion loss, noise figure, isolation and compression (power handling). In particular, FIG. 4 shows the insertion loss and noise figure of the CMOS SPDT T/R switch with the switch in the "ON" state. The insertion loss for Rx switch 302 is indicated using curve 402, while the insertion loss for Tx switch 322 is indicated using curve 404. The noise figure is indicated using cure 406. FIG. 5 shows the isolation of the CMOS SPDT T/R switch in the "OFF" state. Curve 502 indicates the isolation for Rx switch 302 and curve 504 indicates the isolation for Tx switch 322. FIG. 6 is the 1 dB compression point of the CMOS RF SPDT T/R switch in the "ON" state. Note that the insertion loss is reduced by approximately 0.5 dB and the power handling capability is improved by approximately 3-6 dB compared to other known CMOS RF switches.

By now it should be apparent that embodiments of the present invention describe high-performance CMOS RF switches having lower insertion loss and greater power handling capability. The embodiments include a floating/bootstrapped body with remote body contacts. A shunt resonance with a parallel inductor from the input to the output resonates out the capacitance of the transistors to improve isolation. The layout of the RF switches places the switch transistors inside the inductor to provide a small form factor that provides high levels of integration with a lower cost.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A switch, comprising:
a first transistor serially connected to a second transistor;
a first resistor connected from a bias terminal to a source terminal of the first transistor, a second resistor connected from the bias terminal to a drain terminal of the first transistor and to a source terminal of the second transistor, and a third resistor connected from the bias terminal to a drain terminal of the second transistor; and
an inductor having a first terminal connected to the source terminal of the first transistor and a second terminal connected to the drain terminal of the second transistor.

2. The switch of claim 1 wherein the first and second transistors have a floating body that is bootstrapped using body contacts.

3. The switch of claim 1 wherein the switch is controlled to be on or off by a difference in a voltage potential supplied to the bias terminal and a voltage bias supplied to gates of the first and second transistors.

4. The switch of claim 1 further including DC blocking capacitors to isolate an input terminal of the switch from the source terminal of the first transistor and an output terminal of the switch the drain terminal of the second transistor.

5. A switch circuit, comprising:
first and second serially connected transistors coupled between an input and an output, where the transistors have source and drain terminals coupled to a bias terminal via first, second and third resistors; and
an inductor connected in parallel with the first and second serially connected transistors.

6. The switch circuit of claim 5 further including first and second DC blocking capacitors to isolate the input terminal and the output terminal of the switch from the first and second serially connected transistors.

7. The switch circuit of claim 5 further including a bias terminal to supply a voltage bias to a gate of the first transistor and a gate of the second transistor.

8. A radio comprising:
an antenna;
a transceiver; and
a switch having an input coupled to the antenna and an output coupled to the transceiver, the switch including first and second serially connected transistors connected in parallel with an inductor between the input and the output, the switch further including first, second and third resistors connected to a bias terminal and to the source and drain terminals of the first and second transistors.

9. The radio of claim 8 wherein the switch and the transceiver are embedded on-chip using a CMOS technology.

10. The radio of claim 9 wherein a difference in a DC voltage supplied at the bias terminal and a DC bias supplied to gate terminals of the first and second transistors control an on or an off condition of the switch.

11. The radio of claim 8 wherein the switch further includes first and second DC blocking capacitors to isolate the input and the output of the switch from the first and second serially connected transistors.

12. The radio of claim 8 wherein the first and second serially connected transistors have a floating body that is bootstrapped using body contacts.

13. A method to demodulate an over-the-air signal, comprising:
receiving the over-the-air signal at an antenna;
providing the over-the-air signal from the antenna at an input terminal of a switch having first and second serially connected transistors coupled between the input terminal and an output terminal, where the first and second serially connected transistors have source and drain terminals coupled to a bias terminal via resistors; and
controlling a DC voltage provided to gate terminals of the first and second serially connected transistors to be greater than a DC bias supplied at the bias terminal to set the switch to an on condition.

14. The method of claim 13 further including coupling a first resistor between the bias terminal and a source terminal of the first transistor;
coupling a second resistor between the bias terminal and a drain terminal of the first transistor in common with a source terminal of the second transistor; and coupling a third resistor between the bias terminal and a drain terminal of the second transistor.

15. The method of claim 13 further including using body contacts to contact a floating body of the first and second serially connected transistors that is bootstrapped.

16. The method of claim 13 further including supplying the over-the-air signal from the output terminal of the switch to a Low Noise Amplifier (LNA).

* * * * *